US009401369B1

(12) United States Patent
Chen et al.

(10) Patent No.: US 9,401,369 B1
(45) Date of Patent: Jul. 26, 2016

(54) MEMORY DEVICE AND METHOD FOR FABRICATING THE SAME

(71) Applicant: MACRONIX INTERNATIONAL CO., LTD., Hsinchu (JP)

(72) Inventors: Shih-Hung Chen, Hsinchu County (TW); Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/623,630

(22) Filed: Feb. 17, 2015

(51) Int. Cl.
*H01L 27/115* (2006.01)

(52) U.S. Cl.
CPC .... *H01L 27/11568* (2013.01); *H01L 27/11519* (2013.01); *H01L 27/11521* (2013.01); *H01L 27/11556* (2013.01); *H01L 27/11565* (2013.01); *H01L 27/11582* (2013.01)

(58) Field of Classification Search
CPC ............. H01L 21/76879; H01L 23/5226; H01L 27/11519; H01L 27/11521; H01L 27/11556
USPC ......................................................... 257/314
See application file for complete search history.

(56) References Cited

U.S. PATENT DOCUMENTS

| 8,659,949 | B1 | 2/2014 | Chen | |
|---|---|---|---|---|
| 2006/0113547 | A1* | 6/2006 | Shin | H01L 23/5258 257/77 |
| 2008/0137389 | A1* | 6/2008 | Hwang | G11C 5/02 365/51 |
| 2010/0052030 | A1* | 3/2010 | Sakaguchi | H01L 21/3086 257/314 |
| 2010/0163968 | A1* | 7/2010 | Kim | H01L 27/11582 257/324 |
| 2011/0018050 | A1* | 1/2011 | Fujiwara | H01L 27/11524 257/324 |
| 2011/0143524 | A1* | 6/2011 | Son | H01L 27/11548 438/479 |
| 2011/0199804 | A1* | 8/2011 | Son | G11C 5/04 365/51 |
| 2011/0204420 | A1* | 8/2011 | Kim | H01L 27/0688 257/211 |
| 2011/0256672 | A1* | 10/2011 | Wada | H01L 21/76808 438/128 |
| 2011/0260237 | A1* | 10/2011 | Lee | B82Y 10/00 257/325 |
| 2012/0224426 | A1* | 9/2012 | Nam | G11C 16/0483 365/185.11 |

OTHER PUBLICATIONS

Tanaka, et al.: "Bit Cost Scalable Technology with Punch and Plug Process for Ultra High Density Flash Memory"; 2007 Symposium on VLSI Technology Digest of Technical Papers; pp. 14-15.

(Continued)

*Primary Examiner* — Nathan Ha
(74) *Attorney, Agent, or Firm* — McClure, Qualey & Rodack, LLP

(57) ABSTRACT

A memory device comprises plural of silicon-containing layers, string select lines (SSLs), strings, bit lines, metal strapped word lines and plural sets of multi-plugs structure. The silicon-containing layers stacked at a substrate. The SSLs are disposed on the silicon-containing layers and extend along a first direction. The strings are perpendicular to the silicon-containing layers and the SSLs and electrically connected to the SSLs. The bit lines are disposed on the SSLs extending along a second direction and electrically connected to the strings. The plural sets of multi-plugs structure are arranged along the first direction, so as to make the strings disposed between two adjacent sets of multi-plugs structure, wherein each set of multi-plugs structure has plural plugs each corresponding to and connected with one of the silicon-containing layers. Each of the metal strapped word lines is connected to the plugs that are connected to the identical silicon-containing layer.

14 Claims, 18 Drawing Sheets

(56) References Cited

OTHER PUBLICATIONS

Ishiduki, et al.: "Optimal Device Structure for Pipe-shaped BiCS Flash Memory for Ultra High Density Storage Device with Excellent Performance and Reliability"; 97-4244-5640-6/09/$26.00 © 2009 IEEE; pp. 1-4.

Jang, et al.: "Vertical Cell Array using TCAT(Terabit Cell Array Transistor) Technology for Ultra High Density NAND Flash Memory"; 2009 Symposium on VLSI Technology Digest of Technical Papers; pp. 192-193.

U.S. Appl. No. 14/157,550 and actions taken therein.
U.S. Appl. No. 14/582,963 and actions taken therein.
U.S. Appl. No. 14/582,848 and actions taken therein.

* cited by examiner

MEMORY DEVICE AND METHOD FOR FABRICATING THE SAME

BACKGROUND

1. Technical Field

The disclosure in generally relates to a semiconductor device and a method for fabricating the same, and more particularly to a memory device and a method for fabricating the same.

2. Description of the Related Art

Non-volatile memory (NVM) which is able to continually store information even when the supply of electricity is removed from the device containing the NVM cell has been adopted by bulk solid state memory applications in portable audiovisual entertainment devices, cell phones or digital cameras etc. Recently, various three dimensional (3D) memory devices, such as a 3D flash memory device having a single gate, a double gate or a surrounding gate, has been provided in order to accommodate the rising demand for superior memory.

A 3D memory device, such as a vertical-channel (VC) 3D NAND flash memory device that has a multi-layer stack structure may possess a higher density memory and excellent electrical characteristics, e.g. reliability in data storage and high operating speed. As semiconductor features shrink in size and pitch, the parasitic resistance-capacitance (RC) time delays caused by the resistance and capacitance of interconnect conductive lines, such as the word lines or the source lines, may reversely affect the operating speed and reliability of the VC 3D flash memory device. In order to solve these problems, a VC 3D flash memory device with metal gate has been provided.

However, there are still some problems in applying a VC 3D NAND flash memory device with a metal gate. During the process foe fabricating the VC 3D flash memory device, etch trenches passing through a multi-layer stack structure of the VC 3D NAND flash memory device for performing an etching process to remove sacrifice layers and allowing metal gates (word lines) formed on the position where the sacrifice layers originally disposed may be required. However, the etch trenches may occupy space of the multi-layer stack structure and exclude the forming of memory cells. The memory storage density of the VC 3D NAND flash memory device may thus be reduced. Furthermore, the residue of the sacrifice layers may remained in the multi-layer stack structure after the etching process for removing the sacrifice layers is carried out, or otherwise the memory layers could be damaged by over etch while the residue is thoroughly removed by a more aggressive etching process. As a result, defect memory cells may occur and the yield of the VC 3D NAND flash memory device may be also reduced.

Therefore, there is a need of providing an improved memory device and a method for fabricating the same to obviate the drawbacks encountered from the prior art.

SUMMARY

One aspect of the present invention is to provide a memory device, wherein the memory device comprises a plurality of silicon-containing layers, a plurality of string select lines (SSLs), a plurality of strings, a plurality of bit line, plural sets of multi-plugs structure and a plurality of metal strapped word lines. The silicon-containing layers are parallel to each other and vertically stacked at a substrate. The SSLs are disposed on the silicon-containing layers and extend along a first direction. The strings are perpendicular to the silicon-containing layers and the SSLs and electrically connected to the SSLs. The bit lines are disposed on the SSLs extending along a second direction and electrically connected to the strings. The plural sets of multi-plugs structure are arranged along the first direction, so as to make the strings disposed between two adjacent sets of multi-plugs structure. Each set of the multi-plugs structure has a plurality of plugs, and each of the plugs is corresponding to and electrically connected with one of the silicon-containing layers. The metal strapped word lines extend along the first direction, and each of the metal strapped word lines is electrically connected to the plugs that are electrically connected to the identical silicon-containing layer.

According to another aspect of the present invention, a method for fabricating a memory device is provided, wherein the method comprises steps as follows: Firstly, a plurality of silicon-containing layers parallel to each other are formed and vertically stacked at a substrate. A plurality of strings are then formed vertically passing through the silicon-containing layers. Next, a plurality of SSLs extending a long a first direction are formed on the silicon-containing layers and electrically connected to the strings. Subsequently, plural sets of multi-plugs structure are formed and arranged along the first direction, so as to make the strings disposed between two adjacent sets of multi-plugs structure, wherein each set of the multi-plugs structure has a plurality of plugs, and each of the plugs is corresponding to and electrically connected with one of the silicon-containing layers. Thereafter, a plurality of bit lines are formed on the SSLs extending along a second direction and electrically connected to the strings. A plurality of metal strapped word lines extending along the first direction are then formed on the plural sets of multi-plugs structure, wherein each of the metal strapped word lines is electrically connected the plugs that are electrically connected to the identical silicon-containing layer.

In accordance with the aforementioned embodiments of the present invention, a memory device and a method for fabricating the same are provided. Plural sets of multi-plugs structure are formed in a multi-layer stack structure of a memory device including a plurality of silicon-containing layers, and the plural sets of multi-plugs structure are arranged along an extending direction of the SSLs that are formed on the multi-layer stack structure and electrically connected to a plurality of strings vertically passing through the multi-layer stack structure, so as to make some of the plurality of the strings disposed between two adjacent sets of the multi-plugs structure. Each set of the multi-plugs structure has a plurality of plugs, and each of the plugs is corresponding to and electrically connected with one of the silicon-containing layers. The plugs that are electrically connected to the identical silicon-containing layer are electrically connected to a metal strapped word line.

By these approaches, the gate resistance of the memory device can be significantly reduced, and the problems due to the parasitic RC time delays caused by the gate resistance and capacitance of the memory device can be avoided. In addition, since the memory device adopts a silicon based gate instead of a metal gate, thus the process for fabricating a metal gate is no longer required. As a result, the bandwidth of the SSLs can be increased and the problems of defect memory cells and poor yield due to the metal gate process can be also avoided.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 10 is a plan view illustrated in accordance with the structure depicted in FIG. 1B;

DETAILED DESCRIPTION

Figure 1A:
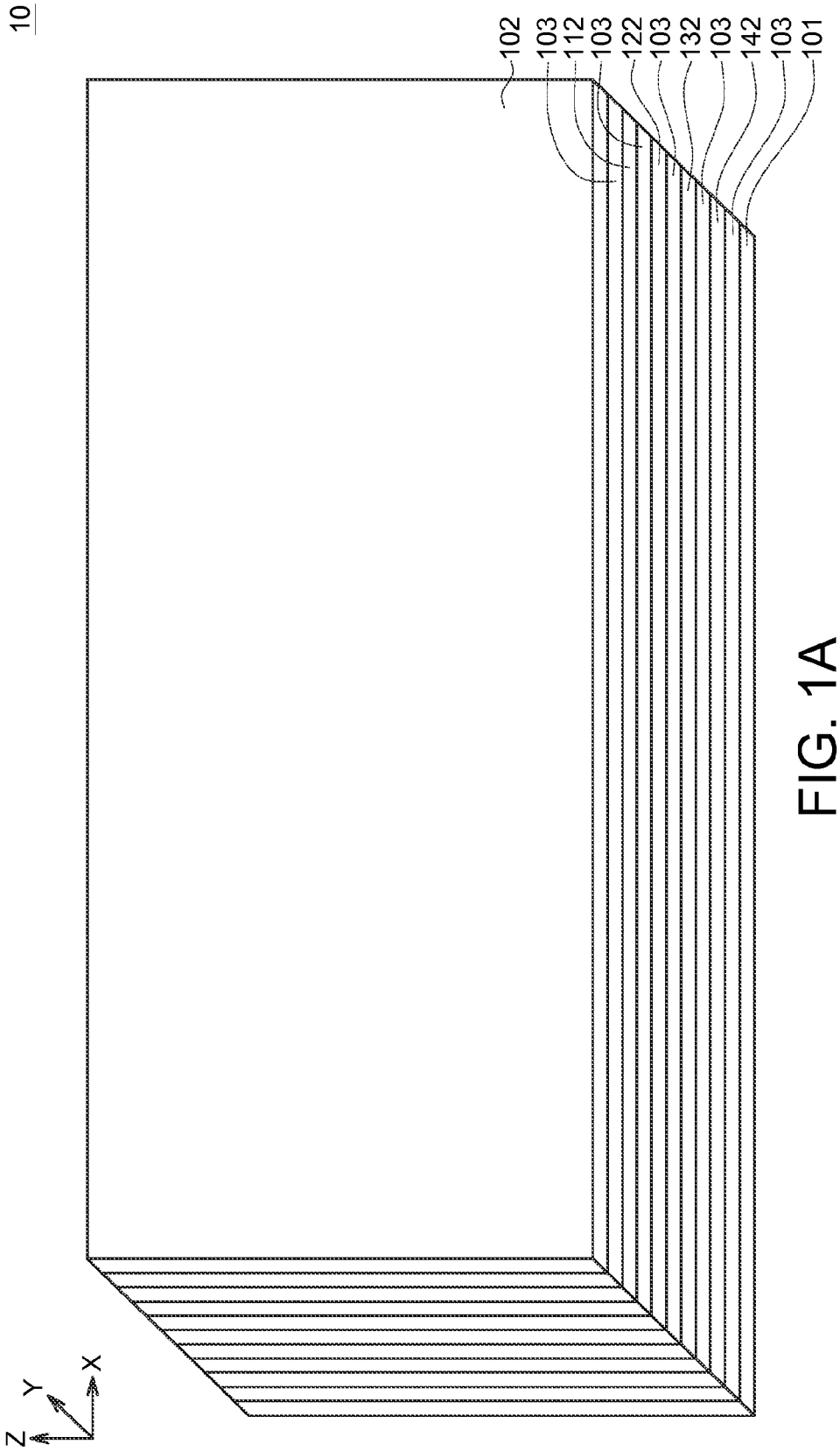
FIG. 1A is a perspective view illustrating a partial structure of a multi-layer stack structure formed on a substrate in accordance with one embodiment of the present invention.

The embodiments as illustrated below provide a VC 3D NAND flash memory device 100 and a method for fabricating the same to avoid the problems due to the parasitic RC time delays of the memory device. The present invention will now be described more specifically with reference to the following embodiments illustrating the structure and method for fabricating the memory device.

It is to be noted that the following descriptions of preferred embodiments of this invention are presented herein for the purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present invention. In addition, the illustrations may not be necessarily be drawn to scale, and the identical elements of the embodiments are designated with the same reference numerals.

The method for fabricating a VC 3D NAND flash memory device 100 comprises steps as follows: A multi-layer stack structure 10 is firstly provided. FIG. 1A is a perspective view illustrating a multi-layer stack structure 10 formed on a substrate 101 in accordance with one embodiment of the present invention. In the present embodiment, the multi-layer stack structure 10 comprises a plurality of silicon-containing layers 102, 112, 122, 132 and 142, and a plurality of insulating layers 103 alternatively vertically stacked along a Z direction and parallel to each other.

In some embodiments of the present invention, the silicon-containing layers 102, 112, 122, 132 and 142 may be made of poly-silicon; and the insulating layers 103 are preferable made of silicon oxide. It should be appreciated that although the multi-layer stack structure 10 depicted in FIG. 1A merely comprises 5 silicon-containing layers and 4 insulating layers, it is just illustrative but not used to limit the number of the silicon-containing layers and the insulating layers that are applied in other embodiments of the present invention.

Figure 1B:
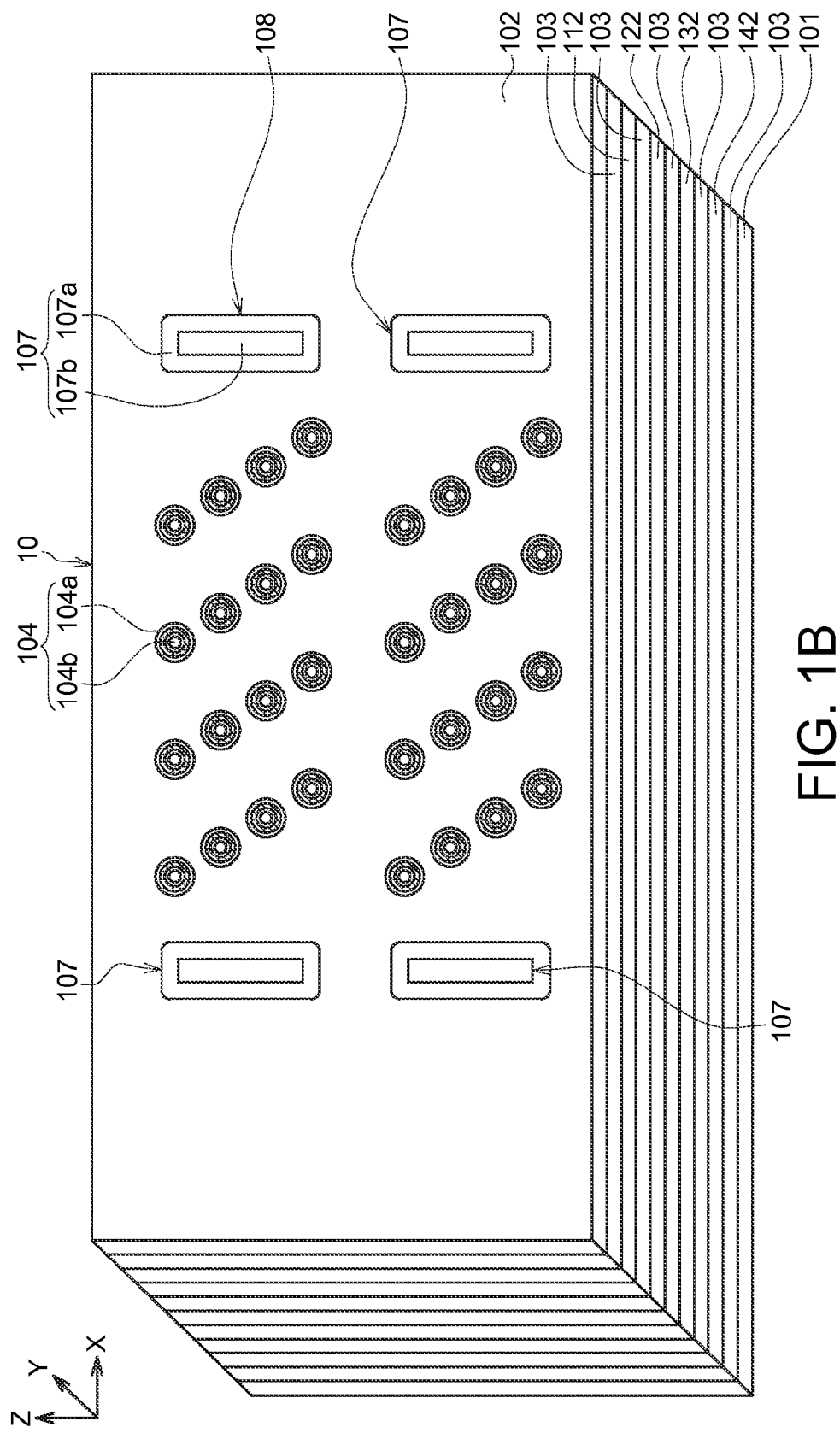
FIG. 1B is a perspective view illustrating the results after a plurality of strings are formed on the structure depicted in FIG. 1A.
Figure 1C:
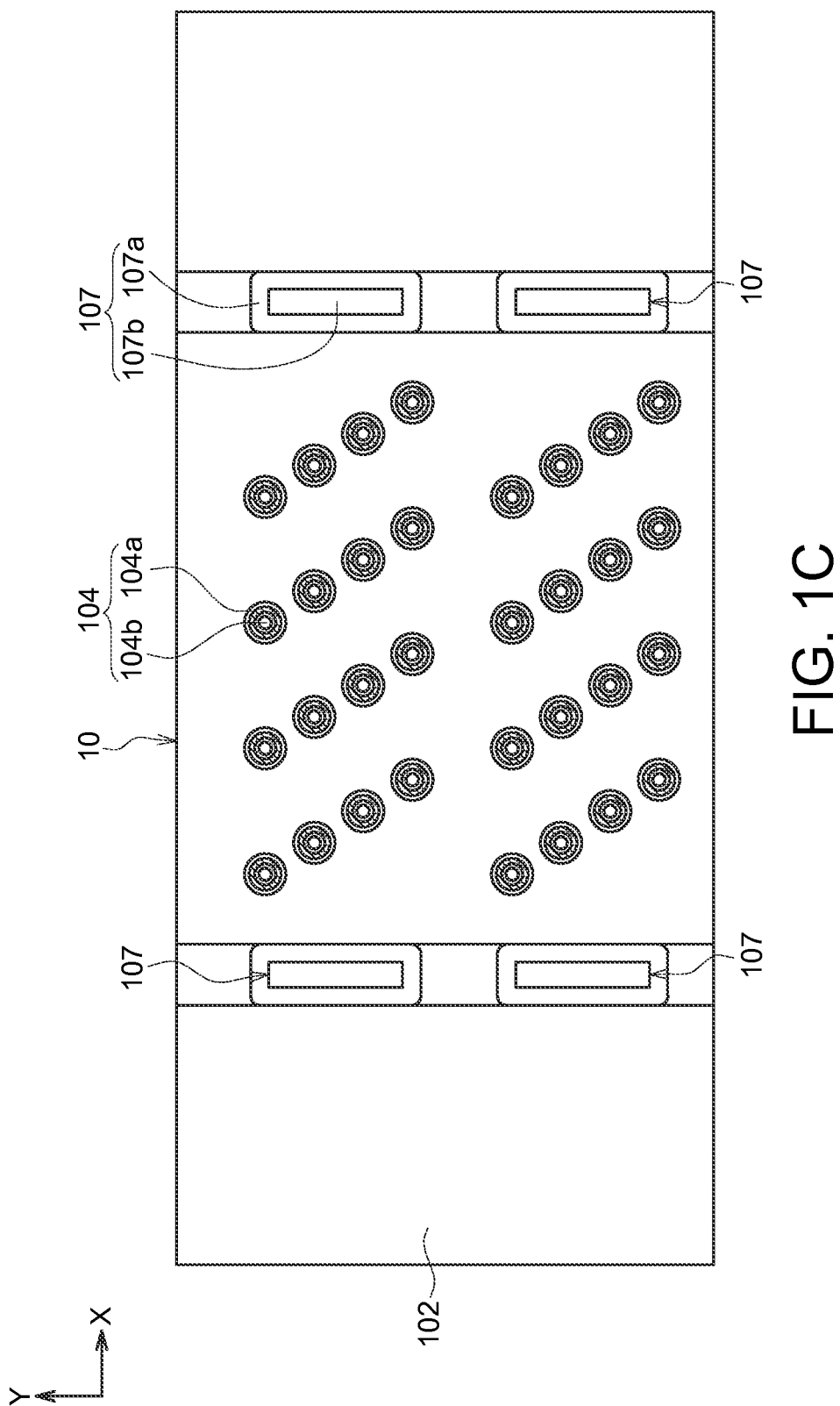
FIG. 1D is a perspective view illustrating the results after a plurality of SSLs are formed on the structure depicted in FIG. 1B.
FIG. 1E is a plan view illustrated in accordance with the structure depicted in FIG. 1D.
FIG. 1F is a perspective view illustrating the results after plural sets of multi-plugs structure and a plurality contact vias are formed on the structure depicted in FIG. 1D.
FIG. 1G is a plan view illustrated in accordance with the structure depicted in FIG. 1F.
FIG. 1H is a plan view illustrating the results after a plurality of source lines and bit lines are formed on the structure depicted in FIG. 1G.
FIG. 1I is a plan view illustrating the results after a plurality of metal strapped word lines are formed on the structure depicted in FIG. 1I.

Next, a plurality of strings 104 vertically passing through the silicon-containing layers 102, 112, 122, 132 and 142 and the insulating layers 103 are formed. FIG. 1B is a perspective view illustrating the results after a plurality of strings 104 are formed on the structure depicted in FIG. 1A. FIG. 10 is a plan view illustrated in accordance with the structure depicted in FIG. 1B.

In some embodiments of the present invention, each of the strings 104 has a memory layer 104a and a channel layer 104b. The memory layer 104a can be an NON structure made of a silicon nitride layer, a silicon oxide layer and a silicon nitride layer. The channel layer 104b preferably consists of poly-silicon. A plurality of memory cells arranged in rows and columns can be defined at the intersections of the strings 104 and the silicon-containing layers 102, 112, 122, 132 and 142.

For example, in some embodiments of the present invention, the memory cells can be arranged as a matrix array. Yet in some other embodiments, the memory cells can be arranged as a honeycomb array. However, the arrangements of the memory cells are not limited. Any suitable arrangements for the design rule of a 3D memory device may be encompassed within the spirit and scope of the present invention.

FIGS. 2A to 2D are cross-sectional views illustrating a method for fabricating the strings 104 in accordance with one embodiment of the present invention. The process for forming the strings 104 comprises steps as follows: Firstly, a plurality of openings 105 passing though the silicon-containing layers 102, 112, 122, 132 and 142 and the insulating layer 103 are formed to expose a portion of the substrate 101 (see FIG. 2A). Subsequently, the memory layer 104a is deposited on the sidewalls and the bottom of the openings 105 and the channel layer 104b is then formed on the memory layer 104a by depositing semiconductor material, such as poly-silicon or germanium (Ge), meanwhile to form the plurality of strings 104 on the sidewalls of the openings 105 (see FIG. 2B).

A hard mask layer 109 is next deposited on the channel layer 104b (see FIG. 2C); and an anisotropic etching process is performed to removing the hard mask layer 109 as well as portions of the memory layer 104a and the channel layer 104b to expose a portion of the substrate 101 from the openings 105. Thereafter, a plurality of source 115 are formed on the exposed portions of the substrate 101, so as to electrically connect the plurality of strings 104 with the substrate 101 serving as a GND layer of the VC 3D NAND flash memory device 100 (see FIG. 2D).

In addition, a plurality of source contact structures 107 are also formed in the multi-layer stack structure 10 during the process for forming the strings 104, wherein the source contact structures 107 are arranged along a X direction, so as to make the strings disposed between two adjacent source contact structures 107 (see FIG. 1O).

In some embodiments of the present invention, the process for forming the source contact structures 107 comprises forming a plurality of slits 108 extending along the Y direction and vertically passing through the silicon-containing layers 102, 112, 122, 132 and 142 and the insulating layer 103 are formed to expose a portion of the substrate 101 by anisotropic etching process 108 simultaneous to the process for forming the opening 105. Subsequently, a dielectric layer 107a is formed on the sidewalls of the slits 108 and conductive material, such as poly-silicon, is then fulfilled in the openings 108, whereby a plurality of source contact structures 107 extending along the Y direction and vertically passing through the silicon-containing layers 102, 112, 122, 132 and 142 and the insulating layer 103 as well as electrically connected to the substrate 101 are formed in the opening 108.

Figure 1D:
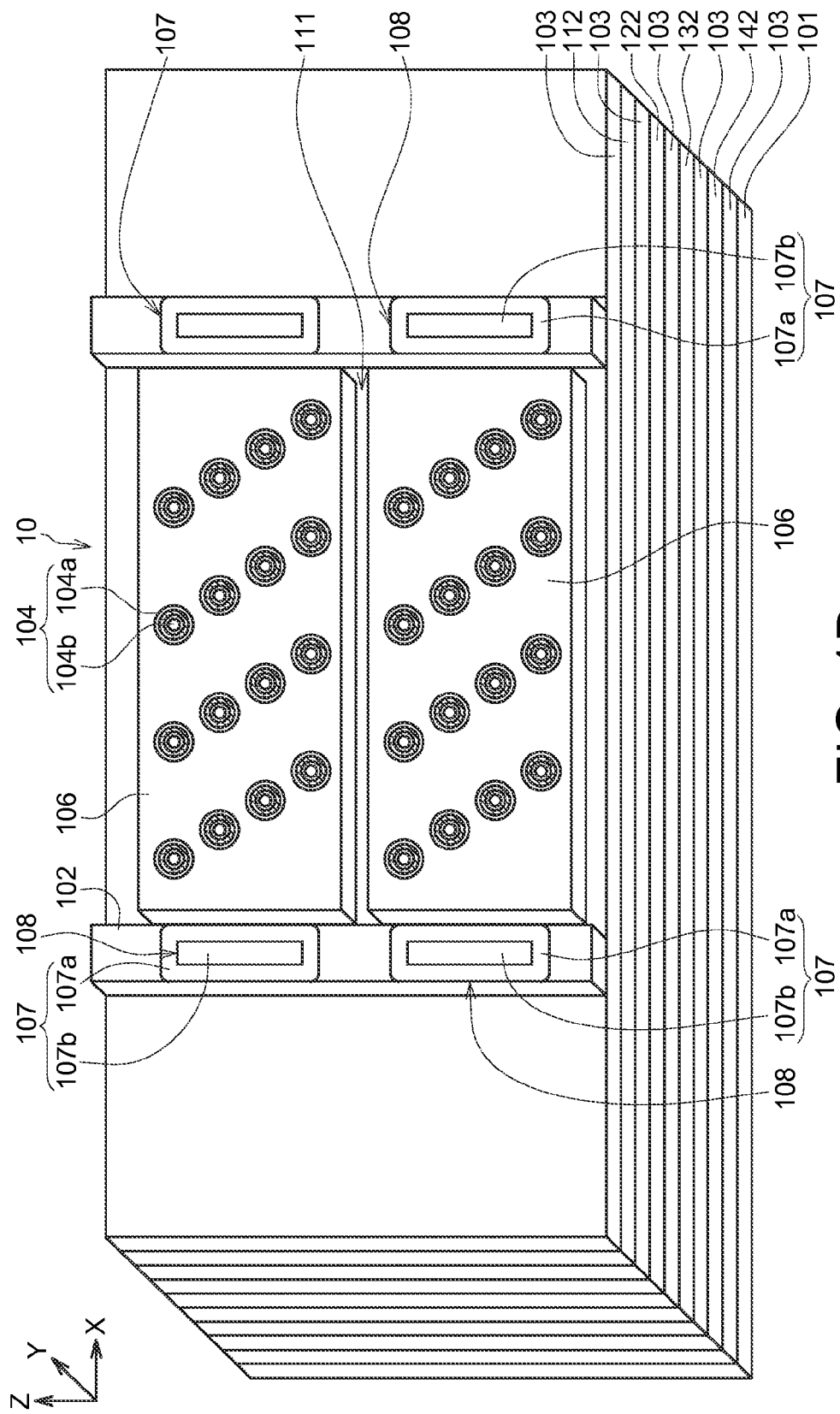
Figure 1E:
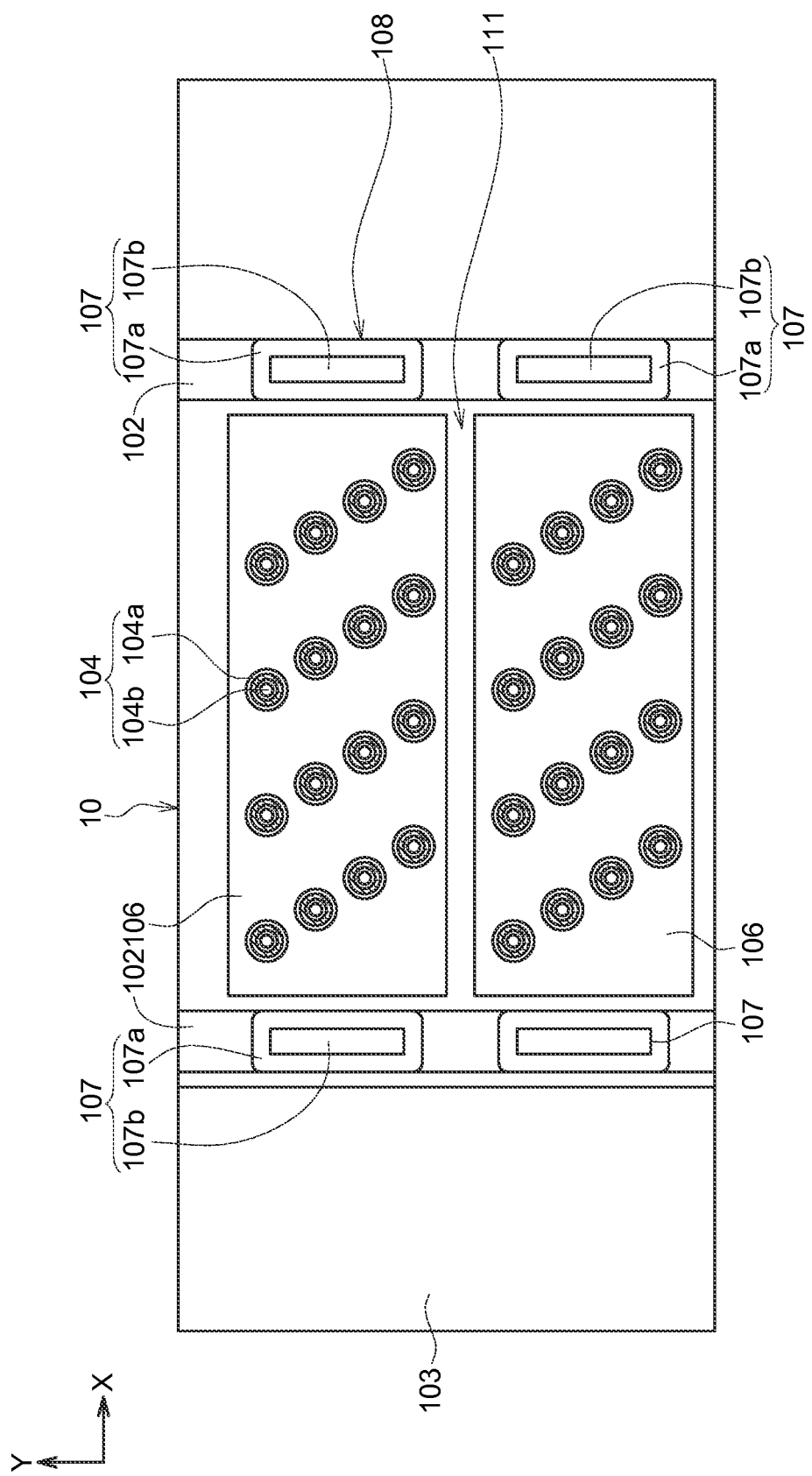

Next, the uppermost silicon-containing layer 102 is patterned to form a plurality of SSLs 106 extending along the X direction. FIG. 1D is a perspective view illustrating the results after a plurality of SSLs 106 are formed on the structure depicted in FIG. 1B. FIG. 1E is a plan view illustrated in accordance with the structure depicted in FIG. 1D. In some embodiments of the present invention, the process for patterning the uppermost silicon-containing layer 102 comprises steps of forming a plurality of trenches 111 to divide the silicon-containing layer 102 into several parts serving as the SSLs 106.

Each of the SSLs 106 is corresponding to and electrically connected to some of the plurality of strings 104. For example, in some embodiments of the present invention, the strings 104 are arranged as a matrix array, and each of the SSLs 106 is corresponding to and electrically connected to 5-10 rows of the plurality of strings 104. Alternatively, in some other embodiments, the strings 104 are arranged as a honeycomb array, and each of the SSLs 106 is corresponding to and electrically connected to 4-20 rows of the plurality of strings 104.

For purposes of making a clearer description, in the present embodiment, the strings 104 are arranged as a honeycomb array, and each of the SSLs 106 is corresponding to and electrically connected to 4 rows of the plurality of strings 104. Since these memory cells formed on the strings 104 can be accessed at the same time by one of the same SSL 106, thus the operation speed of the memory device 100 can be increased. In addition the, because the gates of memory cells formed on the SSLs 106 are made of silicon-containing material rather than metal. Space conserved between the SSLs 106 for forming trenches allowing metal gates formed there though is thus no more necessary. As a result, bandwidth of the SSL's 106 can be increased, the power compulsion of the memory device 100 can be reduced, and the interference between the selected memory cells and unselected cells can be reduced during the read/program operation.

Figure 1F:
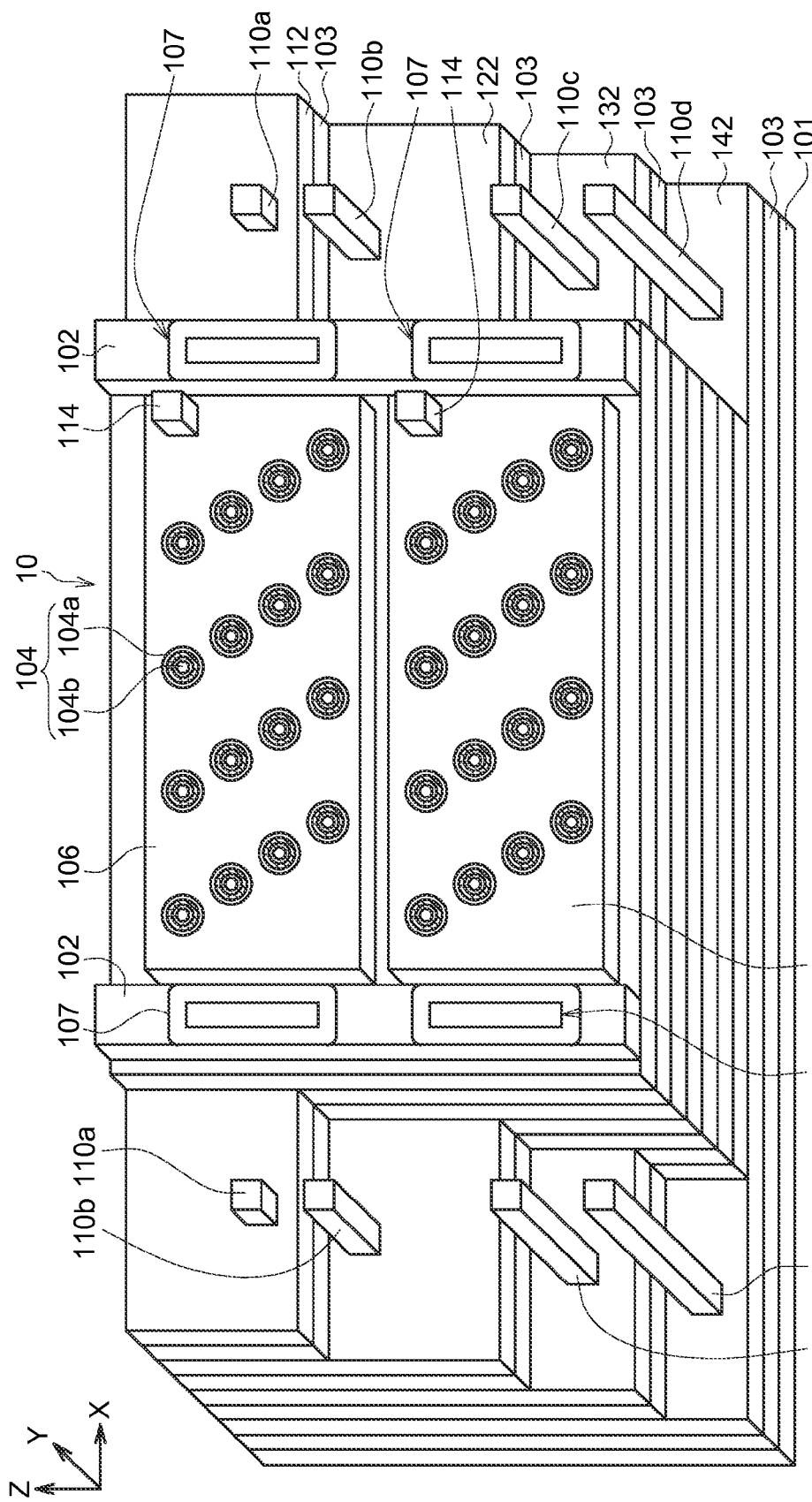
Figure 1G:
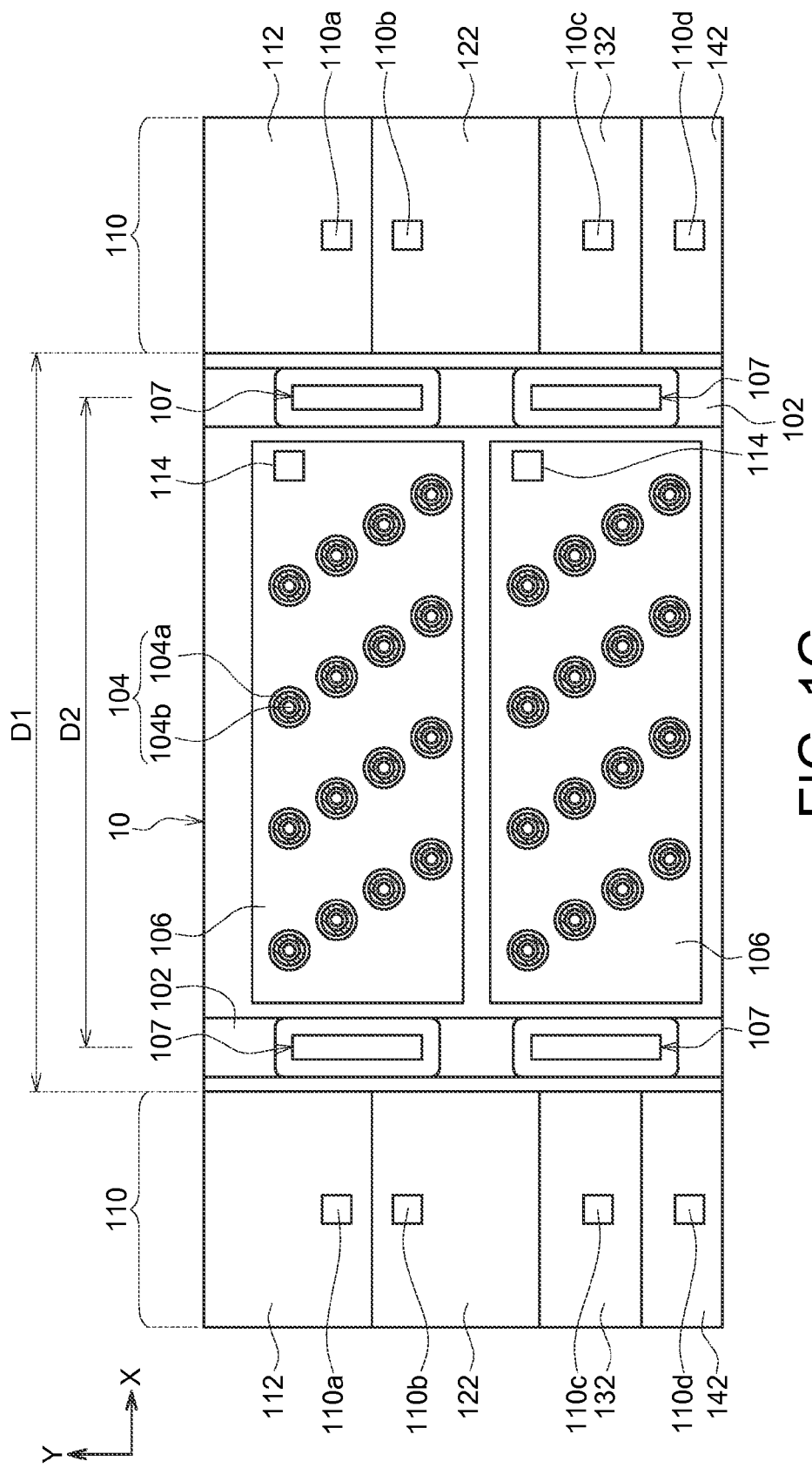

Thereafter, plural sets of the multi-plugs structure 110 arranged along the X direction are formed in the multi-layer stack structure 10, so as to make the strings 104 disposed between two adjacent sets of the multi-plugs structure 110. In addition, a contact via 114 may be formed on each of the SSLs 106 simultaneous to the process for forming the plural sets of the multi-plugs structure 110. FIG. 1F is a perspective view illustrating the results after plural sets of the multi-plugs structure 110 and contact via 114 are formed on the structure depicted in FIG. 1D. FIG. 1G is a plan view illustrated in accordance with the structure depicted in FIG. 1F.

Figure 3:
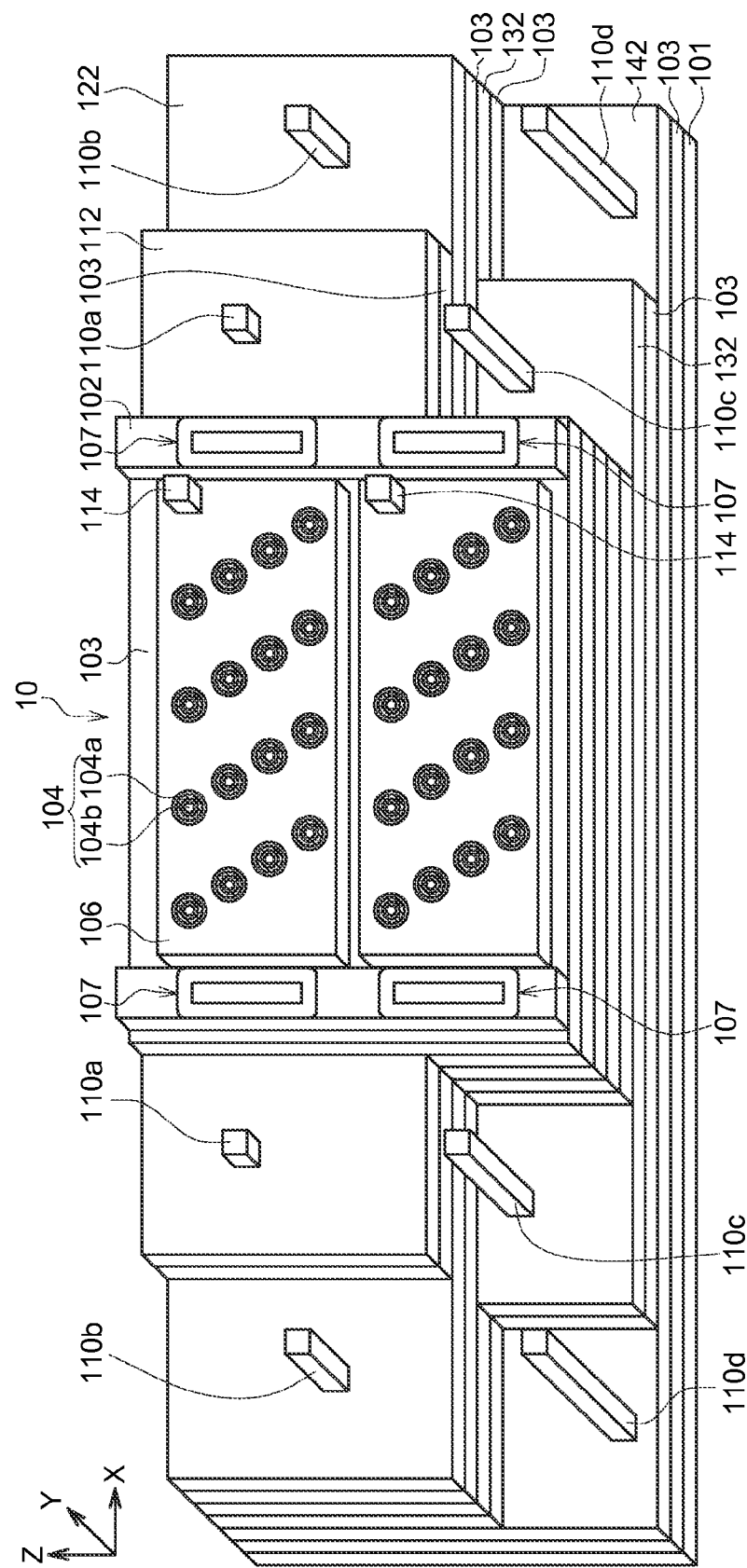
FIG. 3 is a perspective view illustrating a multi-plugs structure shaped in another type of staircase in accordance with another embodiment of the present invention.

In the present embodiment, each set of the multi-plugs structure 110 has a plurality of plugs, such as the plugs 110a, 110b, 110c and 110d, and each of the plugs 110a, 110b, 110c and 110d is corresponding to and electrically connected with one of the silicon-containing layers 112, 122,132 or 142. For example, the plug 110a is corresponding to and electrically connected with the silicon-containing layer 112; the plug 110b is corresponding to and electrically connected with the silicon-containing layer 122; the plug 110c is corresponding to and electrically connected with the silicon-containing layer 132; and the plug 110d is corresponding to and electrically connected with the silicon-containing layer 142. The plugs 110a, 110b, 110c and 110d involved in the same set of the multi-plugs structure 110 are arranged along the Y direction to form a straight staircase parallel to the Y axle. However, the type of the straight staircase depicted in FIGS. 1F and 1G are just illustrative but not limited. In some other embodiments, the plugs 110a, 110b, 110c and 110d involved in the same set of multi-plugs structure 110 may be divided into several groups, such as 2 groups, and the plugs included in different groups may be arranged along the Y direction to form two straight staircases parallel to the Y axle (see FIG. 3).

It should be appreciated that two adjacent sets of the multi-plugs structure 110 are separated for a certain distance, and the distance is determined in accordance with the resistance of the portion of the silicon-containing layers 112, 122, 132 or 142 measured between the two adjacent sets of the multi-plugs structure 110 and the desired operating performance of the VC 3D NAND flash memory device 100. In some embodiments of the present invention, the distance D1 between two adjacent sets of the multi-plugs structure 110 may substantially range from 50 μm to 500 μm, and preferably may be about 100 μm.

Two adjacent source contact structures 107 are also separated for a certain distance determined in accordance with the resistance of the portion of the substrate 101 measured between the two adjacent sets of the multi-plugs structure 110 and the desired operating performance of the VC 3D NAND flash memory device 100. In some embodiments of the present invention each two adjacent source contact structures 107 are separated by a distance D2 substantially greater than or equal to 20 μm.

Although the predetermined distance either between each two adjacent sets of the multi-plugs structure 110 or between each two adjacent source contact structures 107 depicted in the aforementioned embodiments is substantially the same, which means that one set of multi-plugs structure 110 is formed accompanying with one source contact structures 107. But it is worthy to known that the arrangements of the plural sets of the multi-plugs structure 110 and the source contact structures 107 are just illustrative, for the purpose of making a concise description. The predetermined distance either between each two adjacent sets of the multi-plugs structure 110 or between each two adjacent source contact structures 107 may vary respectively. In other words, the distance between two adjacent sets of multi-plugs structure 110 may be different from the distance separated between two adjacent source contact structures 107. In one embodiment, there are a plurality source contact structures 107 are disposed between two adjacent sets of the multi-plugs structure 110.

Figure 1H:
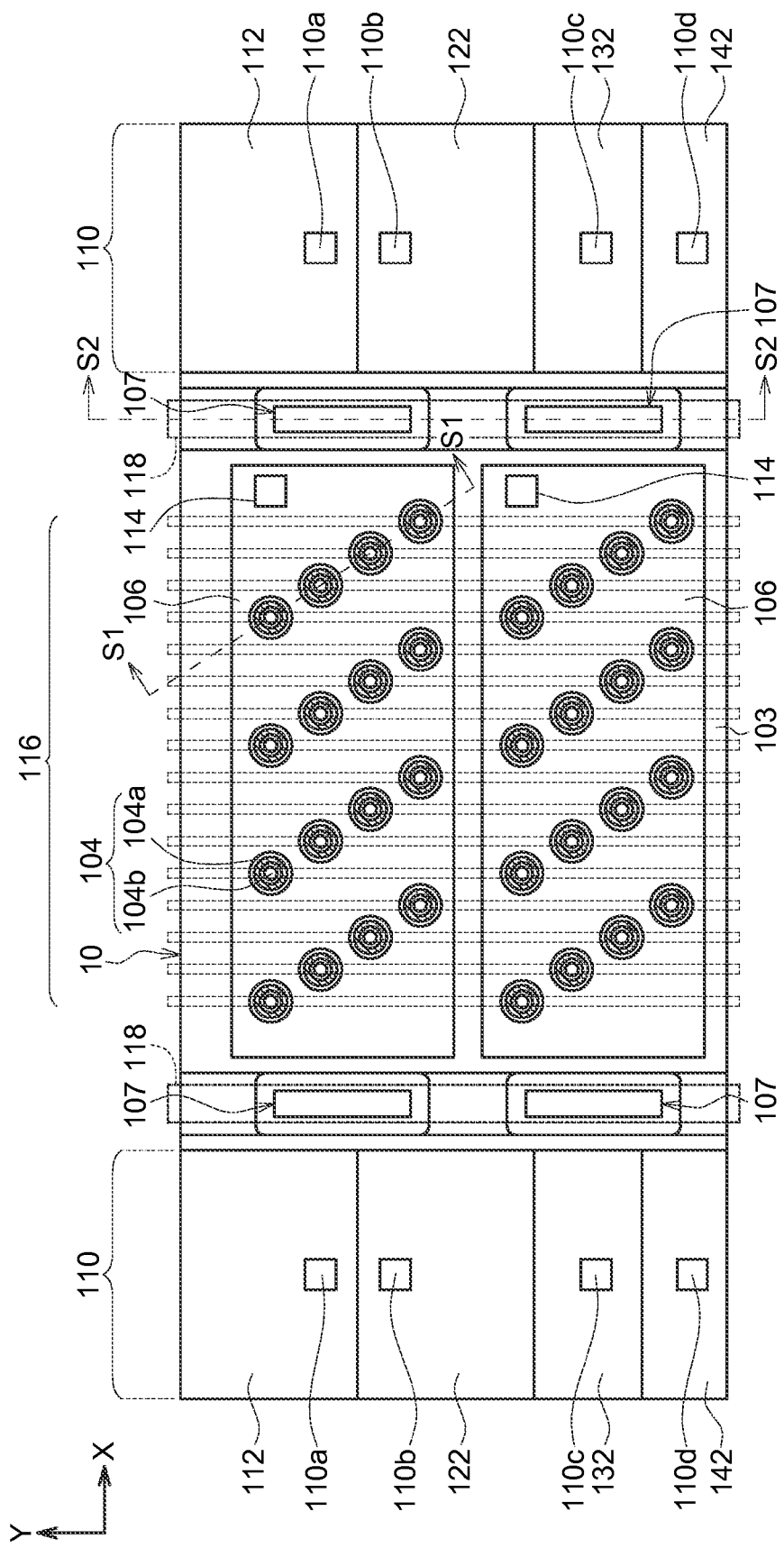

Subsequent, a plurality of source lines 118 are formed on the source contact structures 107 extending along the Y direction, and electrically connected to the source contact structures 107 respectively. A plurality of bit lines 116 are formed on the SSLs 106 extending along the Y direction, wherein each of the bit lines 116 is electrically connected to the one of the strings 104 that are connected to the same SSL 106. FIG. 1H is a plan view illustrating the results after a plurality of source lines and bit lines are formed on the structure depicted in FIG. 1G. In the present embodiment, the source lines 118 and the bit lines 116 are parallel to each other and both are perpendicular to the SSLs 106.

Figure 4A:
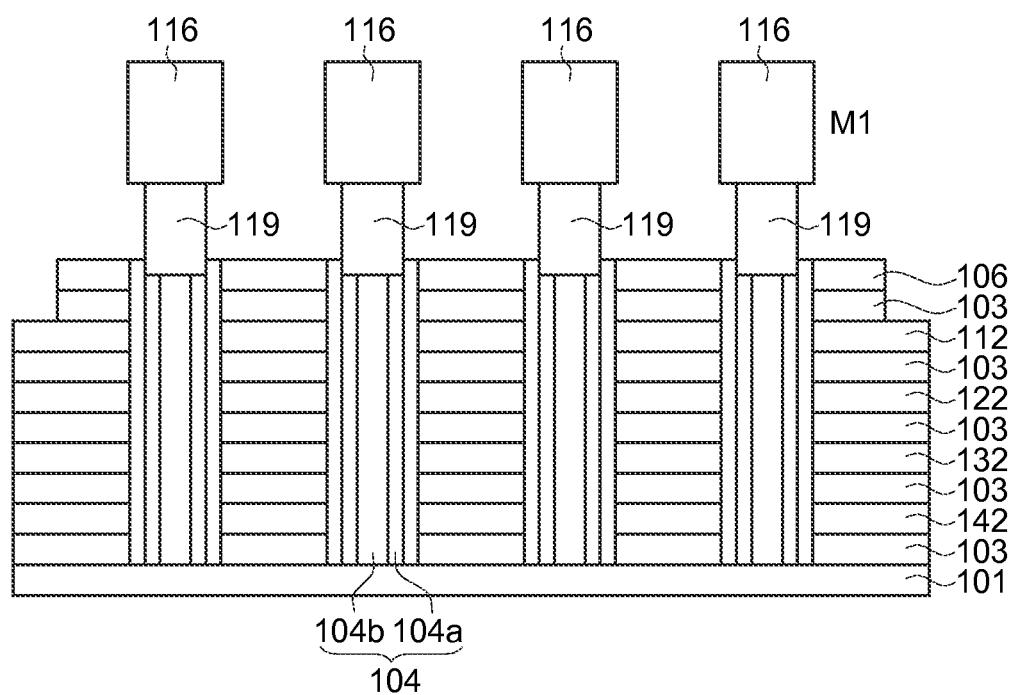
FIG. 4A is a cross-sectional view taken along a line S1 depicted in FIG. 1H.
Figure 4B:
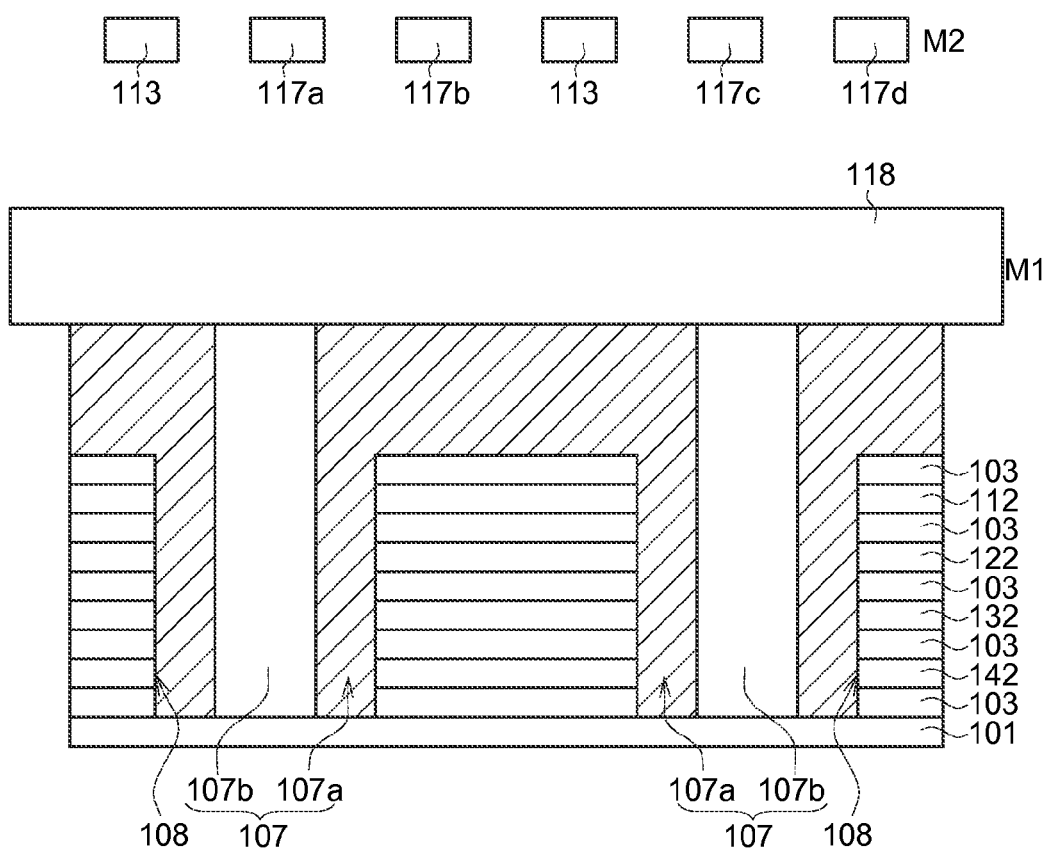
FIG. 4B is a cross-sectional view taken along a line S2 depicted in FIG. 1H.

In some embodiments of the present invention, the source lines 118 and the bit lines 116 may be either formed on the same metal interconnection layer or formed on different metal interconnection layers. FIG. 4A is a cross-sectional view taken along a line S1 depicted in FIG. 1H; FIG. 4B is a cross-sectional view taken along a line S2 depicted in FIG. 1H. In the present embodiment, the source lines 118 and the bit lines 116 are formed on the same metal interconnection layer M1. Each of the bit lines 116 is electrically connected to the corresponding strings 104 through at least one metal interconnection layer and at least one via 119 formed between the metal interconnection layer M1 and the strings 104.

In addition, although the substrate 101 illustrated in the aforementioned embodiments may serve as a GND layer, and the strings 104 are connected to the source lines 118 through the substrate 101 and the source contact structures 107, but the source connection of the VC 3D NAND flash memory device 100 are not limited. For example, FIG. 5 is a cross-sectional view illustrating another connection type of a grounding (GND) layer, a plurality source contact structures and a source lines in accordance with another embodiment of the present invention.

Figure 5:
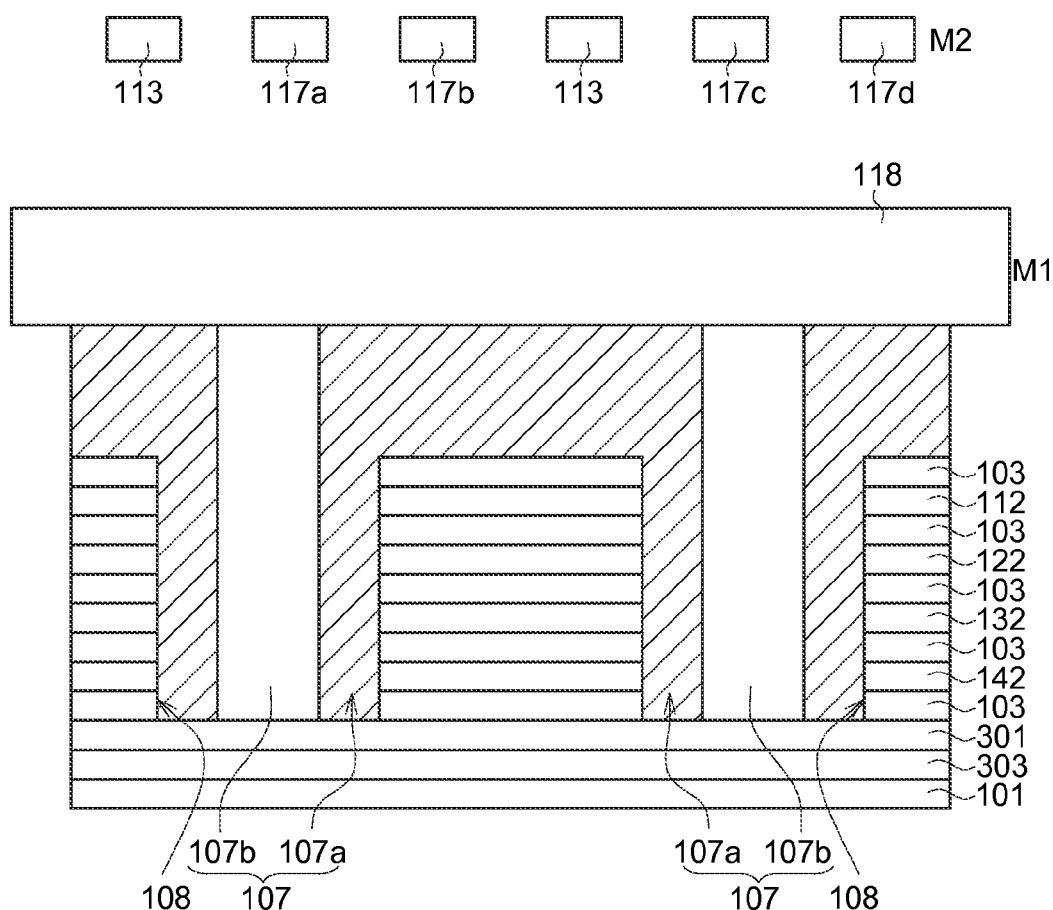
FIG. 5 is a cross-sectional view illustrating another connection type of a grounding (GND) layer, a plurality source contact structures and a source lines in accordance with another embodiment of the present invention.

In the present embodiment, the structure depicted in FIG. 5 is identical to that depicted in FIG. 4B except that FIG. 5 shows an additional GND layer 301 disposed between the substrate 101 and the silicon-containing layer 142, wherein the strings 104 are connected to the source lines 118 through the GND layer 301 and the source contact structures 107, and there are two insulating layers 303 respectively disposed between the substrate 101 and the GND layer 301 and disposed between the GND layer 301 and the silicon-containing layer 142.

Thereafter, a plurality of metal strapped word lines, such as the metal strapped word lines 117a, 117b, 117c and 117d, are formed on the plurality sets of multi-plugs structure 110 and the bit lines 116. Each of the metal strapped word lines 117a, 117b, 117c or 117d extends along the X direction and electrically connected to a plurality of plugs 110a, 110b, 110c or 110d that are electrically connected to the identical silicon-containing layer 112, 122, 132 or 142. In addition, a plurality of metal wires 113 connected to the contact via 114 may be formed simultaneous to the process for forming the metal strapped word lines 117a, 117b, 117c and 117d.

Figure 1I:
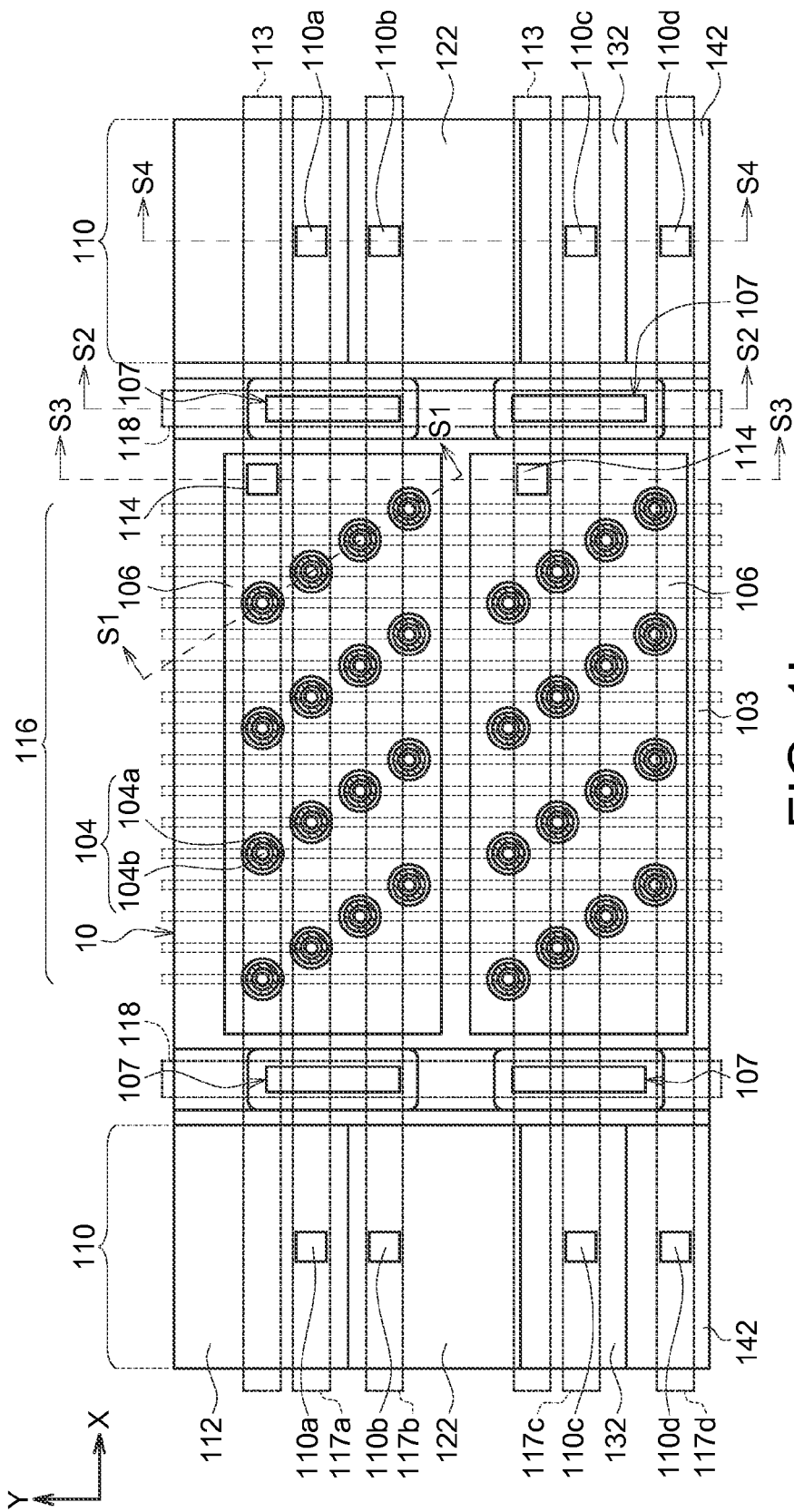
Figure 2B:
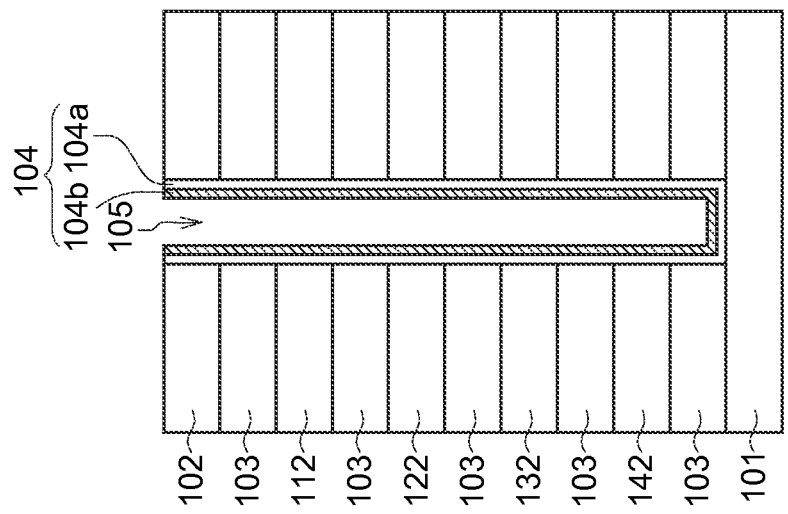
FIGS. 2A to 2D are cross-sectional views illustrating a method for fabricating the strings in accordance with one embodiment of the present invention.
Figure 2A:
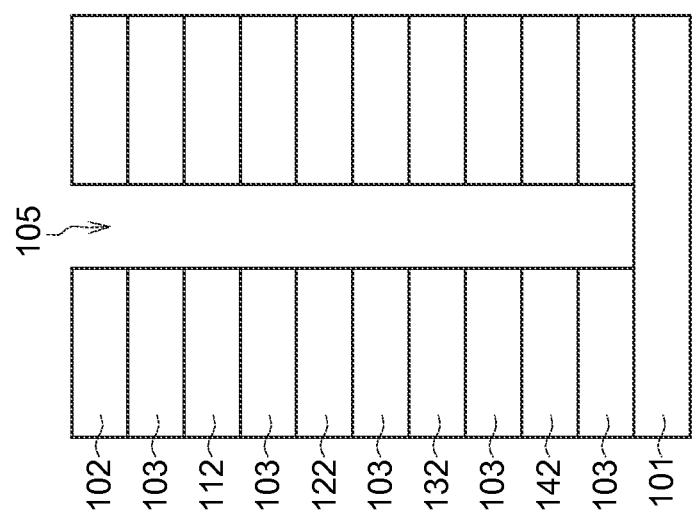
Figure 2D:
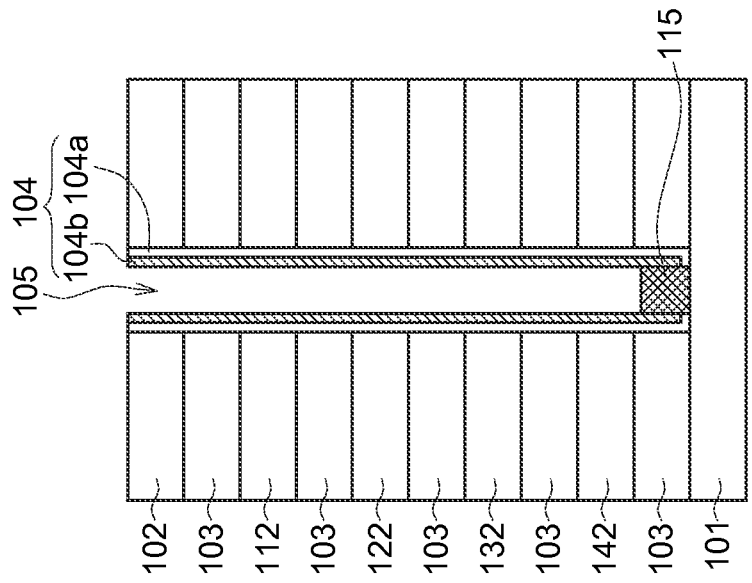
Figure 2C:
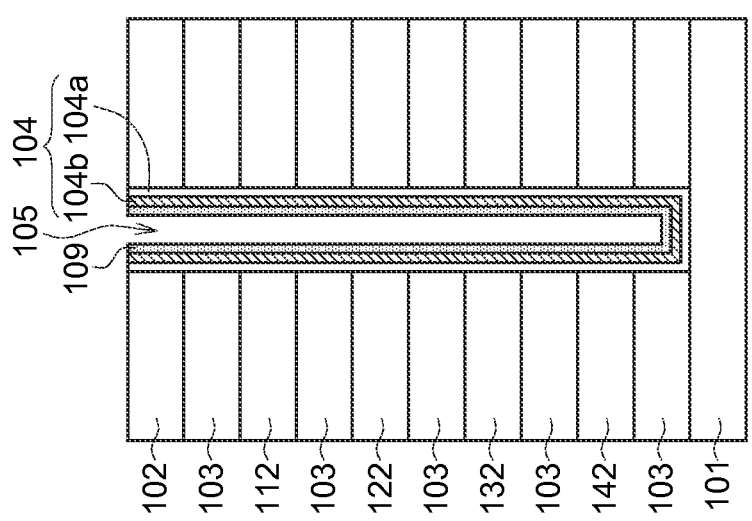

FIG. 1I is a plan view illustrating the results after a plurality of metal strapped word lines 117a, 117b, 117c or 117d and the metal wires 113 are formed on the structure depicted in FIG. 1I. In the present embodiment, the metal strapped word line 117a is electrically connected with the plurality of the plugs 110a that are disposed in different sets of the multi-plugs structure 110 but electrically connected to the identical silicon-containing layer 112; the metal strapped word lines 117b is electrically connected with the plurality of the plugs 110b that are disposed in different sets of the multi-plugs structure 110 but electrically connected to the identical silicon-containing layer 122; the metal strapped word lines 117c is electrically connected with the plurality of the plugs 110c that are disposed in different sets of the multi-plugs structure 110 but electrically connected to the identical silicon-containing layer 132; and the metal strapped word lines 117d is electrically connected with the plurality of the plugs 110d that are disposed in different sets of the multi-plugs structure 110 but electrically connected to the identical silicon-containing layer 142.

The plurality of the plugs 110a, 110b, 110c and 110d involved in the same set of the multi-plugs structure 110 are arranged in series in accordance with the step high of the straight staircase, and each of which is corresponding to and electrically connected to one of the metal strapped word lines 117a, 117b, 117c and 117d that are also arranged in series in accordance with the locations thereof. For example, in the present embodiment, the plugs 110a is corresponding to and electrically connected to the metal strapped word lines 117a; the plugs 110b is corresponding to and electrically connected to the metal strapped word lines 117b; the plugs 110c is corresponding to and electrically connected to the metal strapped word lines 117c; and the plugs 110c is corresponding to and electrically connected to the metal strapped word lines 117c. Accordingly, it can be appreciated that the arrangements (or locations) of the plugs 110a, 110b, 110c and 110d involved in the same set of the multi-plugs structure 110 are corresponding to the arrangements (or locations) of the metal strapped word lines 117a, 117b, 117c and 117d. In some embodiments of the present invention, the distances between each two adjacent plugs 110a, 110b, 110c and 110d may be equal due to the equal pitches between each two adjacent metal strapped word lines 117a, 117b, 117c and 117d.

Figure 6A:
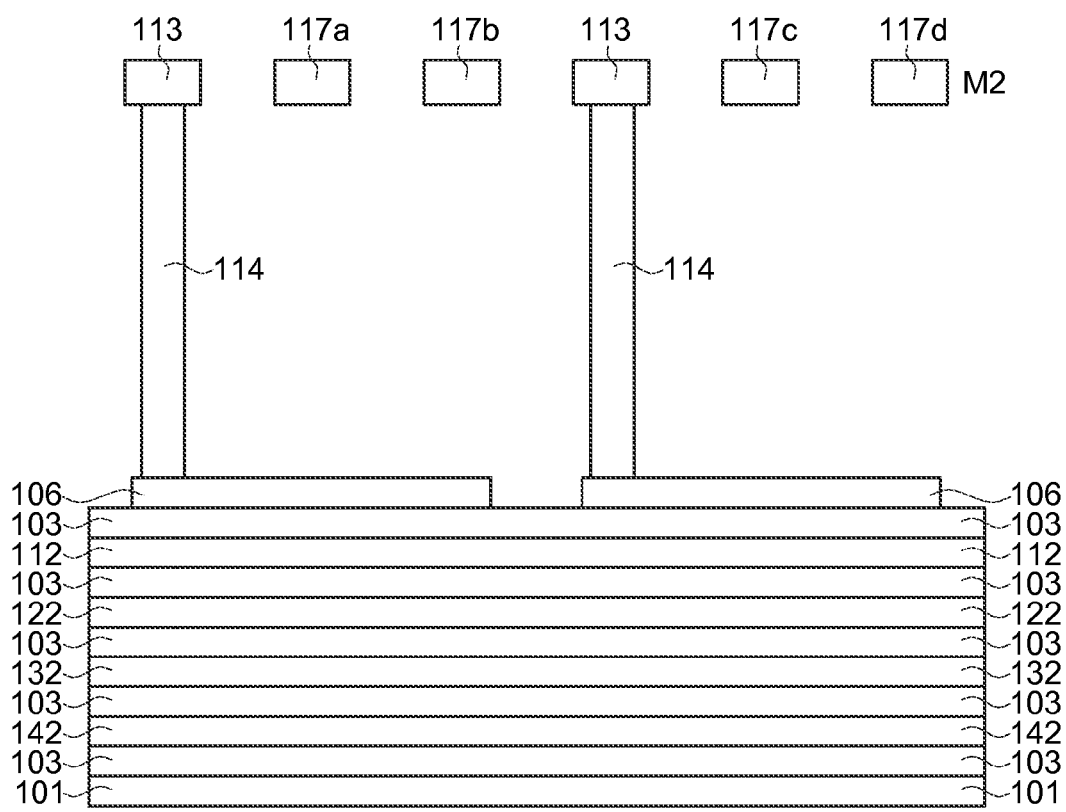
FIG. 6A is a cross-sectional view taken along a line S3 depicted in FIG. 1I.
Figure 6B:
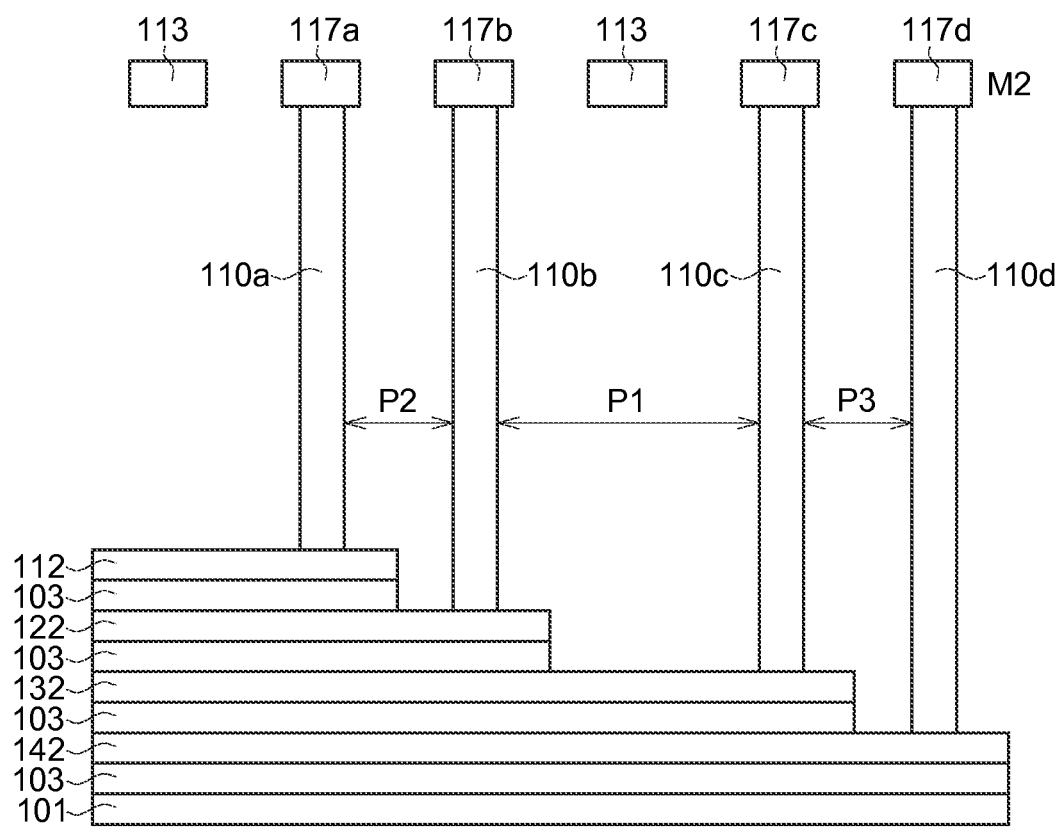
FIG. 6B is a cross-sectional view taken along a line S4 depicted in FIG. 1I.

However, in some other embodiments the distances between each two adjacent plugs 110a, 110b, 110c and 110d may not be equal. FIG. 6A is a cross-sectional view taken along a line S3 depicted in FIG. 1I; FIG. 6B is a cross-sectional view taken along a line S4 depicted in FIG. 1I. In the present embodiment, sine the plurality of metal strapped word lines 117a, 117b, 117c or 117d and the metal wires 113 extend along the same direction are formed on the same metal interconnection layer M2 with a staggered arrangement, thus pitches between each two adjacent metal strapped word lines 117a, 117b, 117c and 117d are not equal.

Accordingly, in the present embodiment, the distance P1 between the two adjacent plugs 110b, and 110c involved in the same set of the multi-plugs structure 110 may be greater than the distance P2 between the two adjacent plugs 110a, and 110b as well as greater than the distance P3 between the two adjacent plugs 110c, and 110d, in order to prevent the plugs 110a, 110b, 110c and 110d form making an undesired contacts with the metal wires 113, wherein the distance P2 is equal to the distance P3.

In some embodiments of the present invention, there are at least N different distances between each two adjacent plugs 110a, 110b, 110c and 110d, wherein N is equal to the number of the metal wires 113 each of which is electrically connected to one of the SSLs 106 through a contact via 114.

The VC 3D NAND flash memory device 100 may be then formed after series downstream processes are carried out. Since the silicon-containing layers 112, 122, 132 and 142 serving as the gates of the memory device 100 are electrically connected with the plugs 110a, 110b, 110c and 110d as well as the metal strapped word lines 117a, 117b, 117c and 117d, thus the resistance of the silicon-containing layers 112, 122, 132 and 142 can be reduced, and the parasitic RC time delays caused by the resistance and capacitance of the gate can be avoided. In some embodiments of the present invention, the resistance of the silicon-containing layers 112, 122, 132 and 142 can be reduced to an equivalent resistance of a metal gate. Accordingly, by applying the approach of the present invention, the prior drawbacks and problems of sacrifice layer residue and over etch resulted from the metal gate process can be also avoided. In addition, because the etch trenches formed in the multi-layer stack structure used for removing the sacrifice layer is no more necessary, the distance between two adjacent SSLs can be thus decreased, and the bandwidth of the SSLs can be increased to contain more memory cells. As a result, the memory density of the VC 3D NAND flash memory device 100 can be increased.

Figure 7:
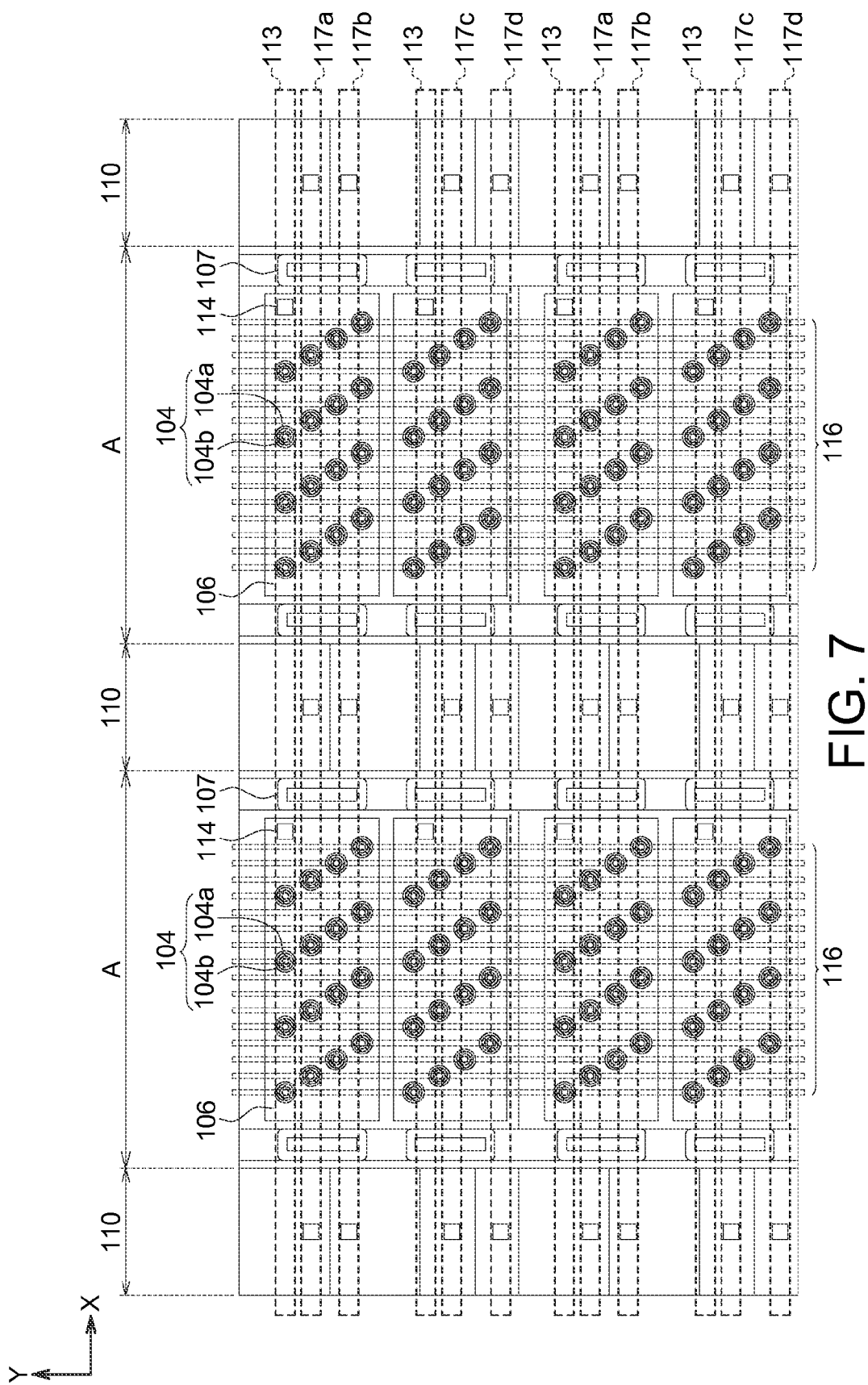
FIG. 7 is a plan view illustrating a partial structure of a VC 3D NAND flash memory device in accordance with another embodiment of the present invention.

FIG. 7 is a plan view illustrating a partial structure of a VC 3D NAND flash memory device 200 in accordance with another embodiment of the present invention. The structure of the VC 3D NAND flash memory device 200 is similar to that of the VC 3D NAND flash memory device 100 except that the VC 3D NAND flash memory device 200 comprises more sets of multi-plugs structure 110 and more source contact structures 107. From a macro perspective, these sets of multi-plugs structure 110 may overlaps with a plurality of SSLs 106, whereby each of the SSLs 106 is divided into a plurality of areas A. In the present embodiment, each of the SSLs 106 is divided into 10 to 100 areas A. In addition, each area A has a contact via 114 formed thereon used to connect to a decoder (not shown) through a metal wire 113. For the purpose of making a clear description, some elements, such as the metal strapped word lines 117a, 117b, 117c and 117d and the source lines 118 are not be shown in the FIG. 5. Persons with skill in the art could image and understand the intact arrangements of the memory device 200 in accordance with the detailed description and accompanying drawings.

In accordance with the aforementioned embodiments of the present invention, a memory device and a method for fabricating the same are provided. Plural sets of multi-plugs structure are formed in a multi-layer stack structure of a memory device including a plurality of silicon-containing layers, and the plural sets of multi-plugs structure are arranged along an extending direction of the SSLs that are formed on the multi-layer stack structure and electrically connected to a plurality of strings vertically passing through the multi-layer stack structure, so as to make some of the plurality of the strings disposed between two adjacent sets of the multi-plugs structure. Each set of the multi-plugs structure has a plurality of plugs, and each of the plugs is corresponding to and electrically connected with one of the silicon-containing layers. The plugs that are electrically connected to the identical silicon-containing layer are electrically connected to a metal strapped word line. By these approaches, the gate resistance of the memory device can be significantly reduced, and the problems due to the parasitic RC time delays caused by the gate resistance and capacitance of the memory device can be avoided. In addition, since the memory device adopts a silicon based gate instead of a metal gate, thus the process for fabricating a metal gate is no longer required. As a result, the bandwidth of the SSLs can be increased and the problems of defect memory cells and poor yield due to the metal gate process can be also avoided.

In some embodiments of the present invention, the memory device further comprises a plurality of source contact structures formed in the multi-layer stack structure and arranged along the extending direction of the SSLs, so as to make some of the plurality of the strings disposed between two adjacent source contact structures, wherein each of the source contact structures extends passing through the silicon-containing layers, so as to electrically connected with the substrate (GND layer). By these approaches, the source resistance of the memory device can be significantly reduced, and the problems due to the parasitic RC time delays caused by the resistance and capacitance of the source lines can be avoided.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A memory device, comprising:
   a plurality of silicon-containing conductive layers, parallel to each other and vertically stacked at a substrate;
   a plurality of string select lines (SSLs), disposed on the silicon-containing conductive layers and extending along a first direction;
   a plurality of strings, perpendicular to the silicon-containing conductive layers and the SSLs, and electrically connected to the SSLs;
   a plurality of bit line, disposed on the SSLs, extending along a second direction and electrically connected to the strings;
   plural sets of multi-plugs structure, arranged along the first direction, so as to make the strings disposed between two adjacent sets of multi-plugs structure, wherein each set of multi-plugs structure has a plurality of plugs, and each of the plugs is corresponding to and electrically connected with one of the silicon-containing conductive layers; and
   a plurality of metal strapped word lines, extending along the first direction, wherein each of the metal strapped word lines is electrically connected the plugs that are electrically connected to the identical silicon-containing conductive layer.

2. The memory device according to claim 1, wherein two adjacent sets of multi-plugs structure are separated by a distance substantially ranging from 50 μm to 500 μm.

3. The memory device according to claim 1, wherein the plugs involved in the same set of multi-plugs structure 110 are arranged along the second direction to form a straight staircase extending parallel to the second direction.

4. The memory device according to claim 3, wherein there are at least N different distances between each two adjacent plugs, wherein N is equal to the number of the SSLs.

5. The memory device according to claim 1, wherein the plural sets of the multi-plugs structure overlap with the SSLs, so as to divide each of the SSLs into a plurality of areas, and each of the areas is connected to a metal wire via a contact via formed thereon.

6. The memory device according to claim 5, wherein each of the SSLs is divided into 10 to 100 areas.

7. The memory device according to claim 1, further comprising a plurality of source contact structures arranged along the first direction, so as to make the strings disposed between two adjacent source contact structures.

8. The memory device according to claim 7, wherein each of the source contact structures is formed in a slit extending along the second direction and vertically passing through the silicon-containing conductive layers, and the source contact structures are electrically connect with the substrate.

9. The memory device according to claim 7, wherein two adjacent source contact structures are separated by a distance substantially ranging from 20 μm.

10. The memory device according to claim 7, further comprising a plurality of source, electrically connecting the strings with the substrate, wherein the source contact structures are electrically connect with the substrate.

11. The memory device according to claim 7, further comprising:
a grounding (GND) layer, disposed between the substrate and the silicon-containing conductive layers; and
a plurality of source, electrically connecting the strings with the GVD layer, wherein the source contact structures are electrically connect with the GVD layer.

12. The memory device according to claim 1, further comprising a plurality of source lines extending a long the second direction, wherein each of the source lines is electrically connected at least one of the source contact structures.

13. A method for fabricating a memory device, comprising:
forming a plurality of silicon-containing conductive layers parallel to each other and vertically stacked at a substrate;
forming a plurality of strings vertically passing through the silicon-containing conductive layers;
forming a plurality of SSLs extending a long a first direction on the silicon-containing conductive layers and electrically connected to the strings;
forming plural sets of multi-plugs structure arranged along the first direction, so as to make the strings disposed between two adjacent sets of multi-plugs structure, wherein each set of multi-plugs structure has a plurality of plugs, and each of the plugs is corresponding to and electrically connected with one of the silicon-containing conductive layers;
forming a plurality of bit lines on the SSLs, extending along a second direction and electrically connected to the strings; and
forming a plurality of metal strapped word lines extending along the first direction on the plural sets of the multi-plugs structure, wherein each of the metal strapped word lines is electrically connected the plugs that are electrically connected to the identical silicon-containing conductive layer.

14. The method according to claim 13, wherein further comprising steps of forming a plurality of source contact structures arranged along the first direction, so as to make the strings disposed between two adjacent source contact structures.

* * * * *